(12) United States Patent  
Nara

(10) Patent No.: US 7,889,198 B2  
(45) Date of Patent: Feb. 15, 2011

(54) DISPLAY METHOD FOR SIGNAL ANALYZER

(75) Inventor: Akira Nara, Kodaira (JP)

(73) Assignee: Tektronix, Inc., Beaverton, OR (US)

( * ) Notice: Subject to any disclaimer, the term of this patent is extended or adjusted under 35 U.S.C. 154(b) by 1215 days.

(21) Appl. No.: 11/129,605

(22) Filed: May 13, 2005

(65) Prior Publication Data

US 2005/0261847 A1 Nov. 24, 2005

(30) Foreign Application Priority Data

May 18, 2004 (JP) ............................. 2004-148368

(51) Int. Cl.
*G06T 11/20* (2006.01)
*G09G 5/22* (2006.01)
*G01R 13/00* (2006.01)
*G01R 13/02* (2006.01)

(52) U.S. Cl. ...................... 345/440; 345/440.1; 702/66; 702/67; 702/68

(58) Field of Classification Search ................. 345/440; 702/77
See application file for complete search history.

(56) References Cited

U.S. PATENT DOCUMENTS

| | | | | |
|---|---|---|---|---|
| 4,801,873 A * | 1/1989 | Takano | ..................... | 324/76.12 |
| 5,075,618 A * | 12/1991 | Katayama | ................. | 324/76.27 |
| 5,347,452 A * | 9/1994 | Bay, Jr. | ........................ | 705/37 |
| 5,381,512 A * | 1/1995 | Holton et al. | ............ | 704/200.1 |
| 5,430,690 A * | 7/1995 | Abel | .......................... | 367/135 |
| 5,444,459 A * | 8/1995 | Moriyasu | ................. | 345/440.1 |
| 5,907,820 A * | 5/1999 | Pan | ............................. | 702/155 |
| 5,950,154 A * | 9/1999 | Medaugh et al. | ............ | 704/226 |
| 6,115,684 A * | 9/2000 | Kawahara et al. | ........... | 704/203 |
| 6,191,571 B1 * | 2/2001 | Fukui et al. | ............. | 324/76.26 |
| 6,229,316 B1 * | 5/2001 | Fukui et al. | ................. | 324/624 |
| 6,275,020 B1 * | 8/2001 | Nagano | .................... | 324/76.27 |
| 6,316,928 B1 * | 11/2001 | Miyauchi | ................. | 324/76.27 |
| 6,484,111 B1 * | 11/2002 | Nara | ........................... | 702/77 |
| 6,501,705 B1 * | 12/2002 | Molini et al. | ............... | 367/135 |
| 6,631,341 B2 * | 10/2003 | Kameda et al. | ............. | 702/124 |
| 6,681,191 B1 * | 1/2004 | Pickerd et al. | ................ | 702/76 |
| 6,862,558 B2 * | 3/2005 | Huang | ........................ | 702/194 |
| 6,989,833 B2 * | 1/2006 | Narita | ..................... | 345/440.1 |
| 7,164,358 B2 * | 1/2007 | Lian et al. | ................ | 340/572.1 |
| 7,254,191 B2 * | 8/2007 | Sugar et al. | ................. | 375/340 |
| 7,366,993 B2 * | 4/2008 | Joffrain et al. | .............. | 715/764 |
| 7,653,550 B2 * | 1/2010 | Schulz | ....................... | 704/278 |
| 2004/0260540 A1 * | 12/2004 | Zhang | ........................ | 704/205 |

OTHER PUBLICATIONS

YMEC software, Introduction to Simple Sound Measurement, Dec. 2004, pp. 1-4.*
The Emu Speech Database System: Version 1.2, Chapter 3, May 2003, pp. 1-5.*
L. De Vito et al, "A 3D Spectrum Analyzer Prototype for 3G Mobile Telecommunication Systems", IMTC 2004, Como, Italy May 18-20, 2004.

* cited by examiner

*Primary Examiner*—M Good Johnson
(74) *Attorney, Agent, or Firm*—Francis I. Gray; Michael A. Nelson

(57) ABSTRACT

A rectangle marker on a display of a signal analyzer simultaneously designates time and frequency intervals of data from a signal under test for analysis. The data of the signal under test is displayed as a graph having time and frequency axes. Sub-graphs show data designated by the rectangle marker as processed in the time domain, frequency domain and modulation domain. The resulting display provides an overview of the signal under test and simultaneously provides displays of measurements and analyzes for a designated portion of the data.

8 Claims, 7 Drawing Sheets

DISPLAY METHOD FOR SIGNAL ANALYZER

BACKGROUND OF THE INVENTION

The present invention relates to spectrum analysis, and more particularly to a method of displaying a marker having variable time and frequency scales on a graph of a signal under test, and to displaying sub-graphs relating to data designated by the marker.

In wireless communication using digital modulation, such as that represented by a cell phone or wireless LAN, wireless signals are complicated in that they limited to a finite frequency resource and therefore use either multiple-carriers or time division multiplexing with a burst signal. FIG. 1 shows an example of a display presented by a conventional spectrum analyzer used for analyzing these complex signals. The display is divided into three view areas—A, B and C. View area A shows a three-dimensional spectrogram display where the X or horizontal axis indicates frequency, the Y or vertical axis indicates time and a variation of color or brightness indicates magnitude of power. The spectrogram provides an overview of time, frequency and power of a signal under test. View area A has a pair of time cursors 12 and 14, and view areas B and C show the analytical result of processing the data within the area delimited by the cursors, i.e., view areas B and C are sub-graphs for view area A. Specifically, view area B presents a display of power vs. frequency and view area C presents an analytical display in a modulation domain, such as a constellation of symbols, EVM (Error Vector Magnitude), etc. The display of FIG. 1 is suitable for analyzing a time variable signal like a burst signal, but not for analyzing each carrier in a multiple-carrier signal because there are no means to delimit an area, or band, in the frequency axis direction.

FIG. 2 shows an example of displays provided by another conventional spectrum analyzer that also divides the display into three view areas—A, B and C. View area A presents a spectrogram that has a pair of frequency cursors 16 and 18 that designate a band of frequencies under analysis, with the results being displayed in view areas B and C. The display of FIG. 2 provides a zoom function, i.e., a graphical extended analysis on the designated frequency band along the frequency axis by reprocessing the time domain data stored in a memory for that frequency band using a time-to-frequency conversion algorithm, such as a Fast Fourier transform (FFT). Specifically, view area B displays an extended power vs. frequency graph of the designated frequency band in the signal under test. View area C displays a constellation of the symbols within the designated frequency band in the signal under test. This display is suitable for analyzing a signal transmitting information in a frequency divisional scheme, such as multi-carriers, but it does not consider separation on the time axis.

FIG. 3 shows an example of displays by another conventional spectrum analyzer, the technology of which is disclosed in "A 3D Spectrum Analyzer Prototype for 3G Mobile Telecommunication Systems", IMTC2004-Instrumentation and Measurement Technology Conference, Como, Italy, 18-20 May 2004. View area A is a spectrogram derived from a kind of fast Fourier transform, or the Wigner-Ville Distribution, changing a window function according to the signal under test. This display provides three-dimensional data on cross-sections of frequency and time axes at the same time. View area B of FIG. 3 shows a power vs. frequency display at the time of a dotted cursor 20, and view area D shows a power vs. time graph at the frequency of a dotted cursor 22. However, FIG. 3 does not present a display that designates time and frequency intervals that have desired widths. Further the display of FIG. 3 cannot provide a display in the modulation domain.

A signal analyzer suitable for providing the displays shown in FIGS. 1 and 2 is disclosed in U.S. Pat. No. 6,484,111 (Akira Nara), for example. The signal analyzer produces frequency domain data by an FFT processing circuit from corresponding time domain data. The signal analyzer has means to feed back the time domain data once stored in a memory to the FFT processing circuit so that it recreates a desired range of frequency domain data in the signal under test that a user want to analyze.

The above conventional display methods do not provide an effective analysis for a complex signal multiplexing frequency and time dimensions. The method of FIG. 1 does not analyze a plurality of carriers on the frequency axis by separating them. In other words, the method of FIG. 1 divides time into desired intervals to obtain proper time resolution, but not proper frequency resolution in exchange for the time resolution. The method of FIG. 2 extracts data on the frequency axis, but not on the time axis, i.e., too much time data decreases time resolution and it is difficult to set a proper time resolution according to the measurement. The method of FIG. 3 displays cross-sections at a desired time and frequency, but is not suitable for analyzing a signal having some bandwidth, and does not handle modulation domain analysis.

Therefore, what is desired is a method of extracting a desired portion of a signal under test effectively from the viewpoints of both the time and frequency domains to analyze and display it.

SUMMARY OF THE INVENTION

Accordingly the present invention provides a method for a signal analyzer of displaying a signal under test which presents data for the signal under test as a display having time and frequency axes as a function of a marker that indicates user definable time and frequency scales, and then displays sub-graphs relating to the data that are included in the desired time and frequency scales of the marker. This makes it possible to designate a desired portion of the signal under test from the viewpoints of both the time and frequency to measure the characteristics in comparison with the conventional display methods. This makes it easy to balance between both time and frequency resolutions.

The objects, advantages and other novel features of the present invention are apparent from the following detailed description when read in conjunction with the appended claims and attached drawing.

DETAILED DESCRIPTION OF THE INVENTION

Figure 1:
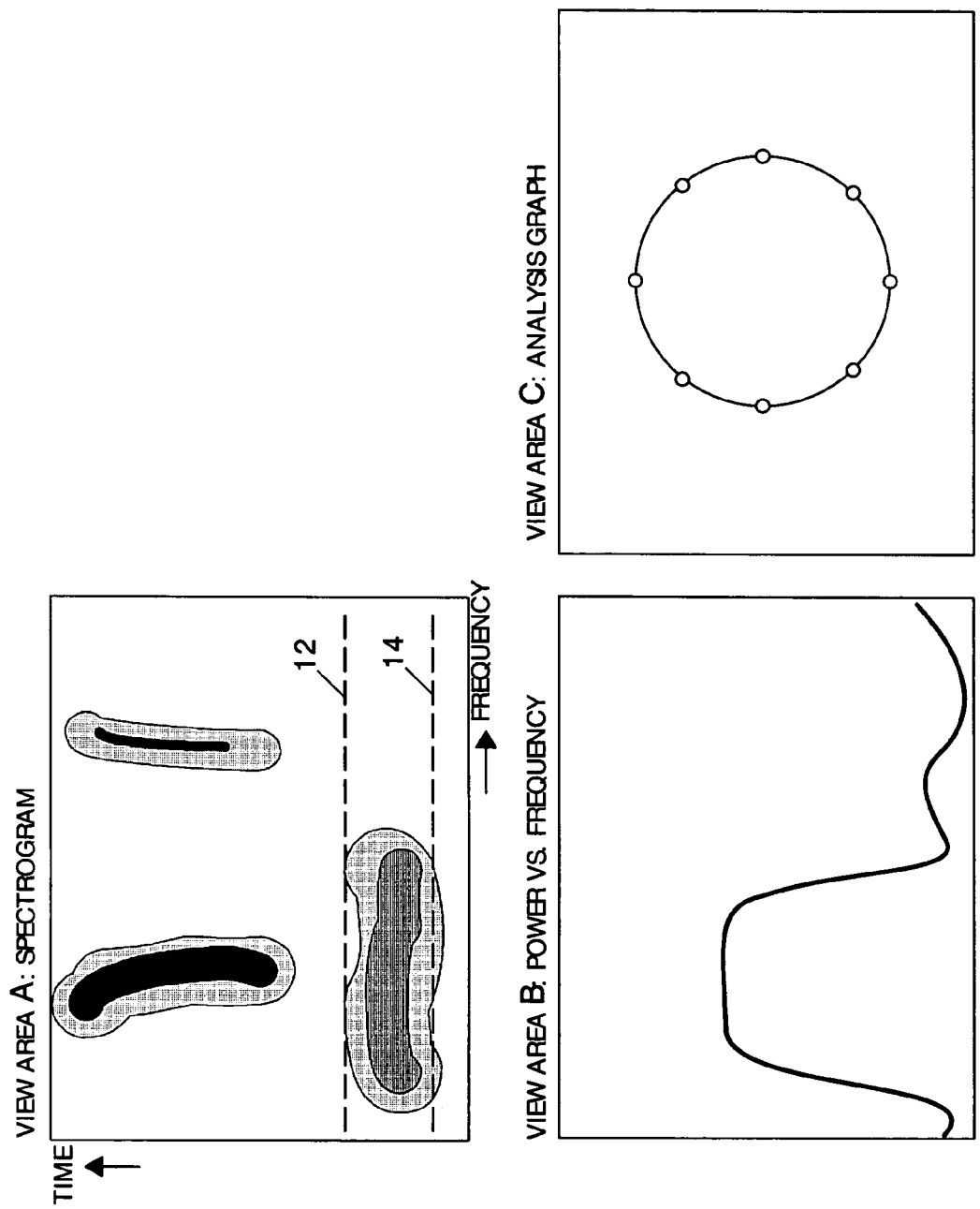
FIG. 1 is a plan view of a display for a signal under test provided by a conventional spectrum analyzer.
Figure 2:
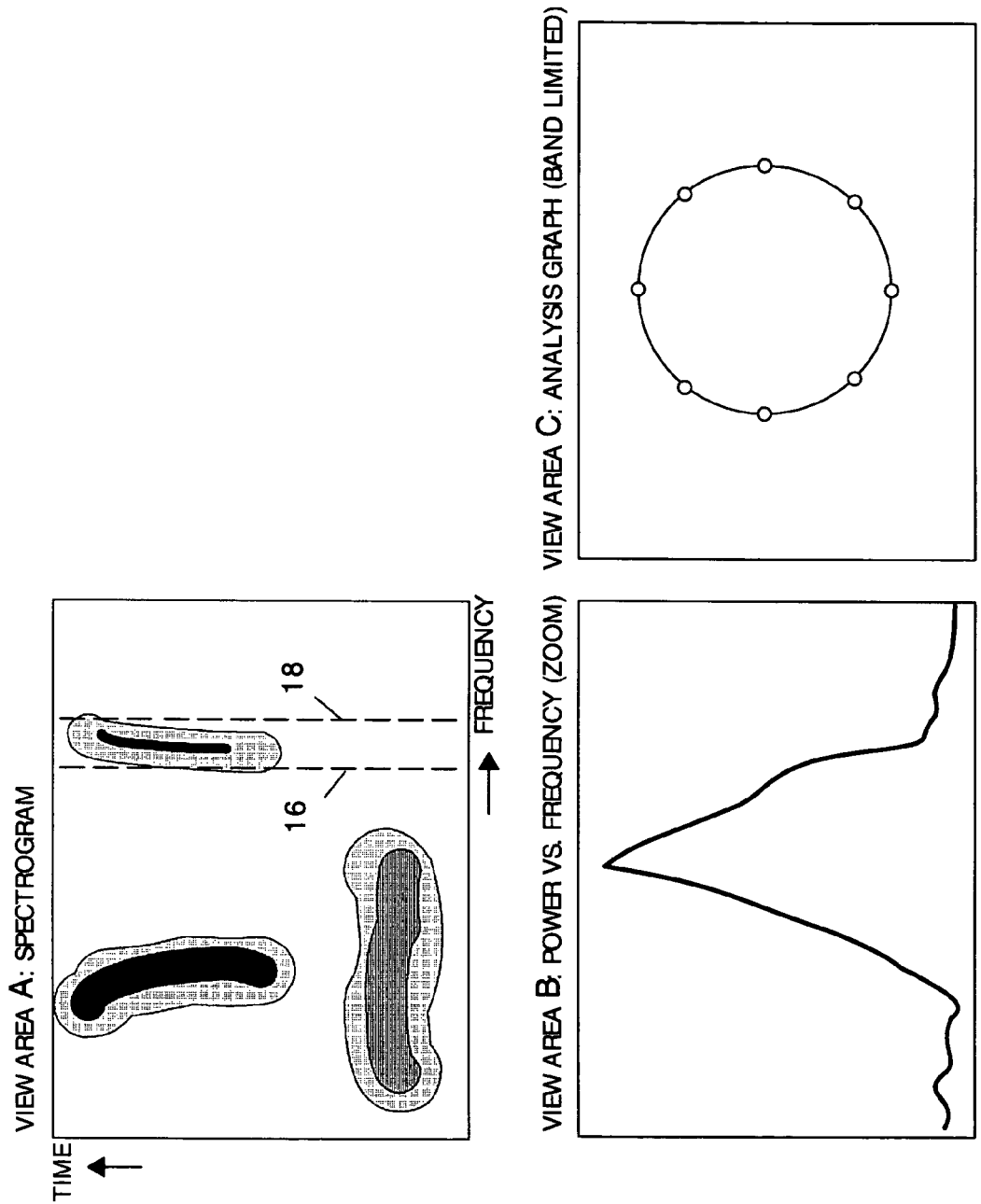
FIG. 2 is a plan view of a display for a signal under test provided by another conventional spectrum analyzer.
Figure 3:
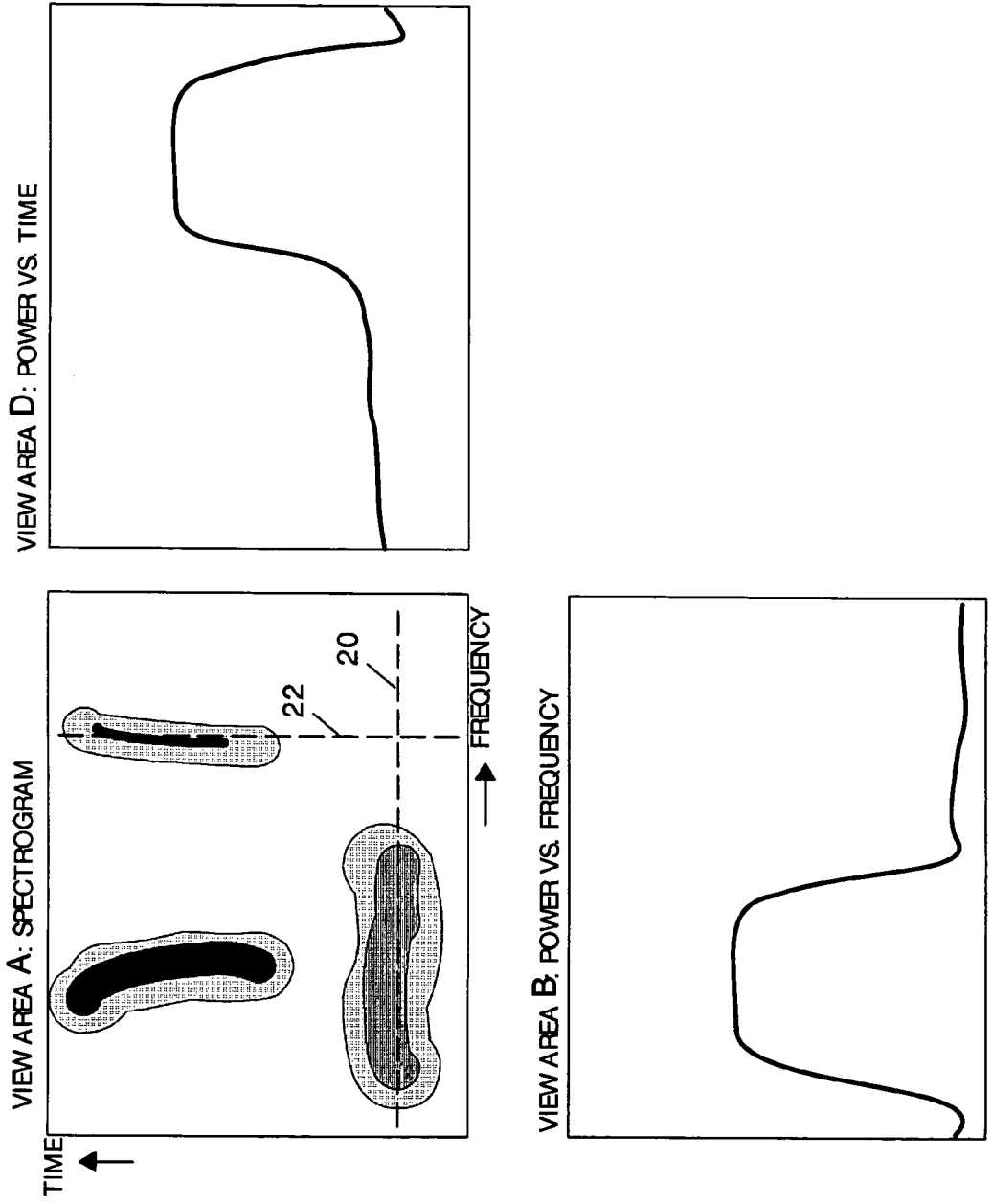
FIG. 3 is a plan view of a display for a signal under test provided by yet another conventional spectrum analyzer.
Figure 4:
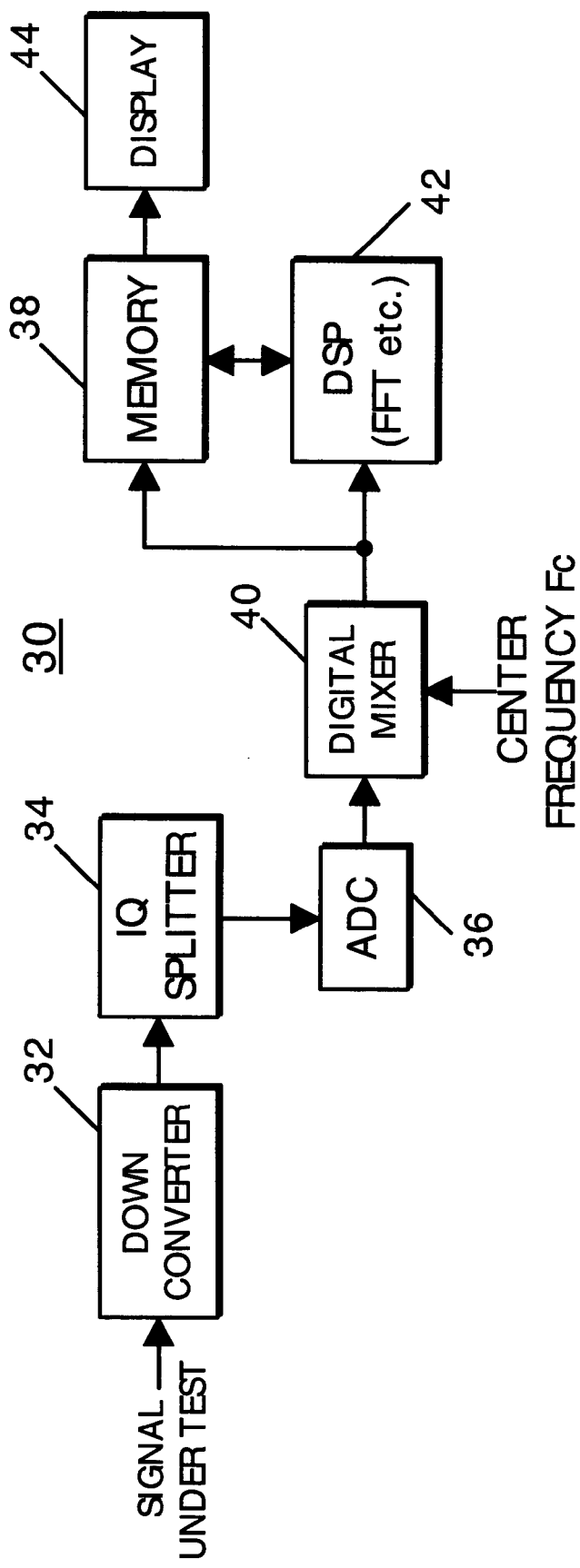
FIG. 4 is a block diagram view of a spectrum analyzer according to the present invention.

Referring now to FIG. 4 a signal analyzer 30 is shown that has a conventional microprocessor, mouse, keyboard, hard disk drive (HDD), etc. (not shown) and operates according to a program stored in the HDD under control of the microprocessor. A user sets up a center frequency Fc, position and size of a rectangle marker on the display conventionally, i.e., with the mouse, keyboard, etc. A frequency down converter 32 converts a signal under test, such as a digital modulation signal for a cell phone, to a signal having an intermediate frequency (IF) lower than a carrier frequency for the signal under test. An IQ separator 34 separates the intermediate frequency into I and Q components. An analog-to-digital converter (ADC) 36 converts the IQ components into digital time domain data respectively and provides them to a digital mixer 40. U.S. Pat. No. 6,340,883 (Akira Nara) discloses an accurate IQ separation technique. The digital mixer 40 further converts the digital IQ signals to a lower frequency according to a user designated center frequency Fc, and provides the frequency converted digital time domain data to a memory 38 and a digital signal processor (DSP) 42. The DSP 42 converts the IQ time domain data pairs into frequency domain data by a time-to-frequency conversion algorithm, such as a fast Fourier transform (FFT), and provides them to the memory 38. The DSP 42 also reads out time domain data once stored in the memory 38 to process them by the FFT again and performs an analytical process, such as digital demodulation, to recover symbols and error vector magnitude (EVM) values. The data from the DSP 42 are provided to the memory 38 as display data for a display 44 according to methods described blow.

Figure 5:
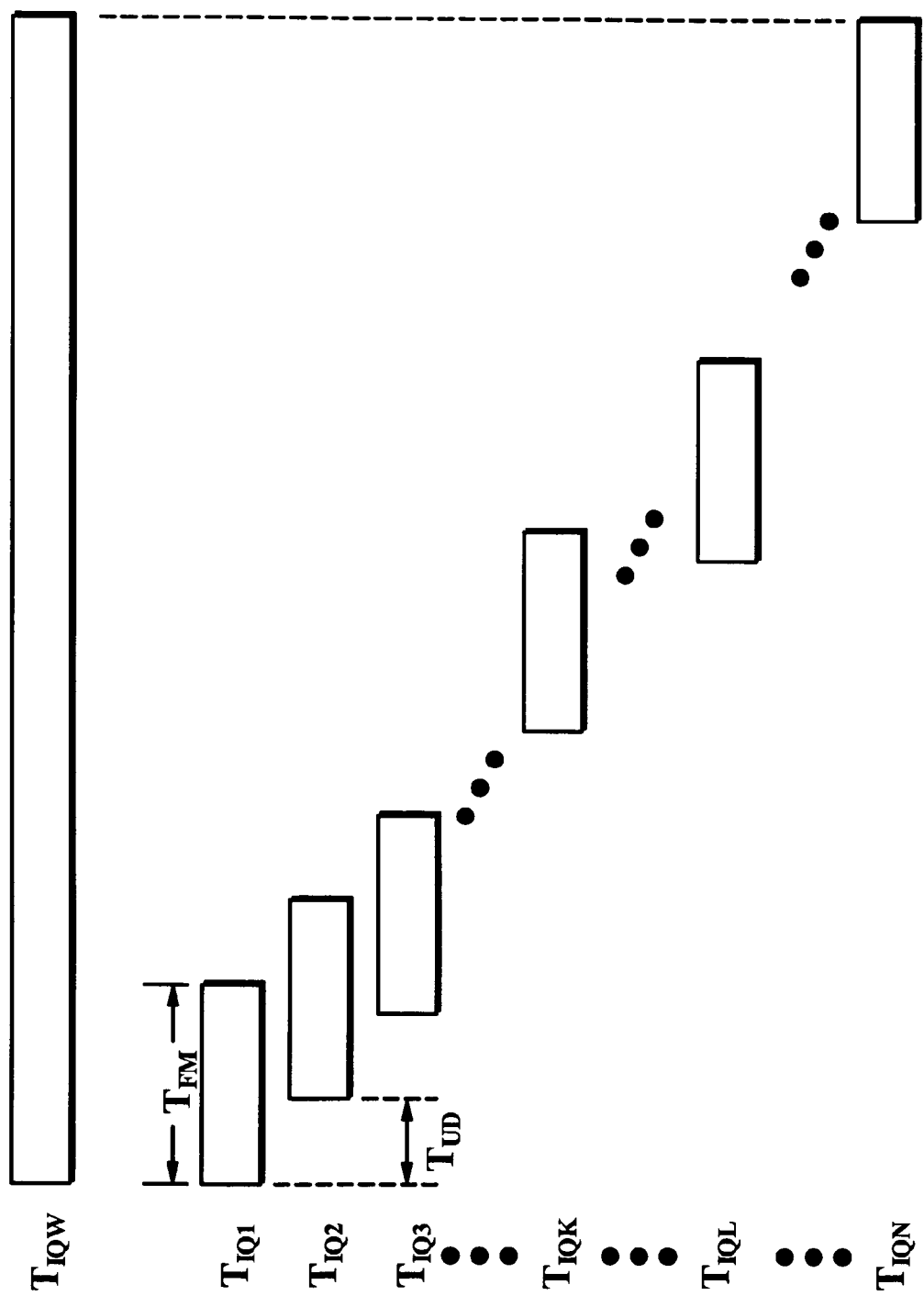
FIG. 5 is a plan view of a conceptual chart illustrating short interval FFTs according to the present invention.
Figure 6:
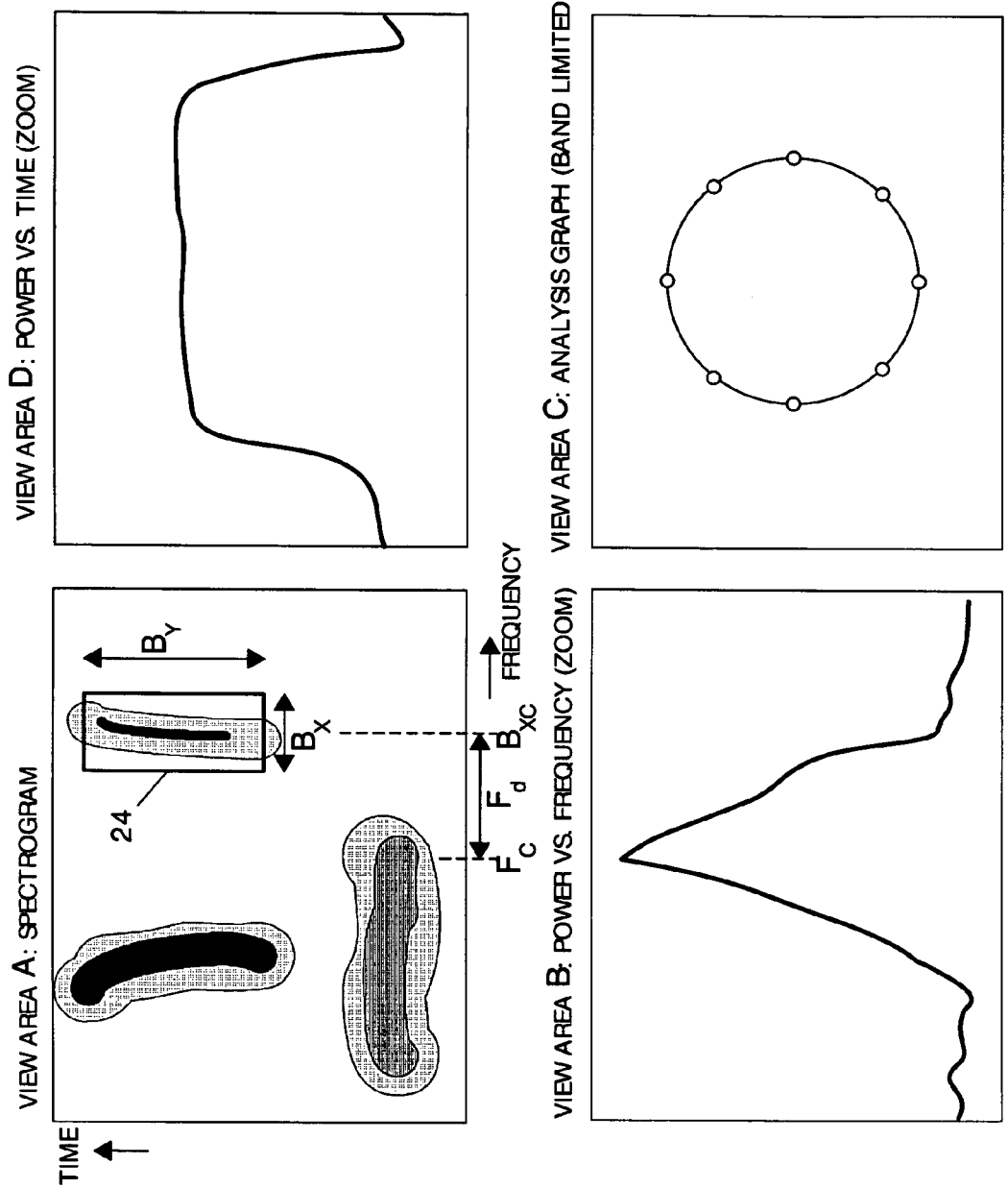
FIG. 6 is a plan view of a display for a signal under test using a rectangle marker according to the present invention.

Referring to FIG. 5, the I and Q data pairs constitute the time domain data for the signal under test, and when the total length of the time domain data is $T_{IQW}$, it is divided into n intervals as frame lengths $T_{FM}$ having a frame update time $T_{UD}$. The time domain data within each time interval is processed by the fast Fourier transform (FFT) to convert the time domain data within each time interval into frequency domain data. This process is the same as before. The result is displayed as a spectrogram as shown in FIG. 6 view area A. The center of the X axis is the center frequency Fc designated by the user. Then, the user confirms an overview of the signal under test. The spectrogram may be displayed in the left upper corner, or view area A, of a quartered screen on the display 44 of the signal analyzer as shown in FIG. 6.

Figure 7:
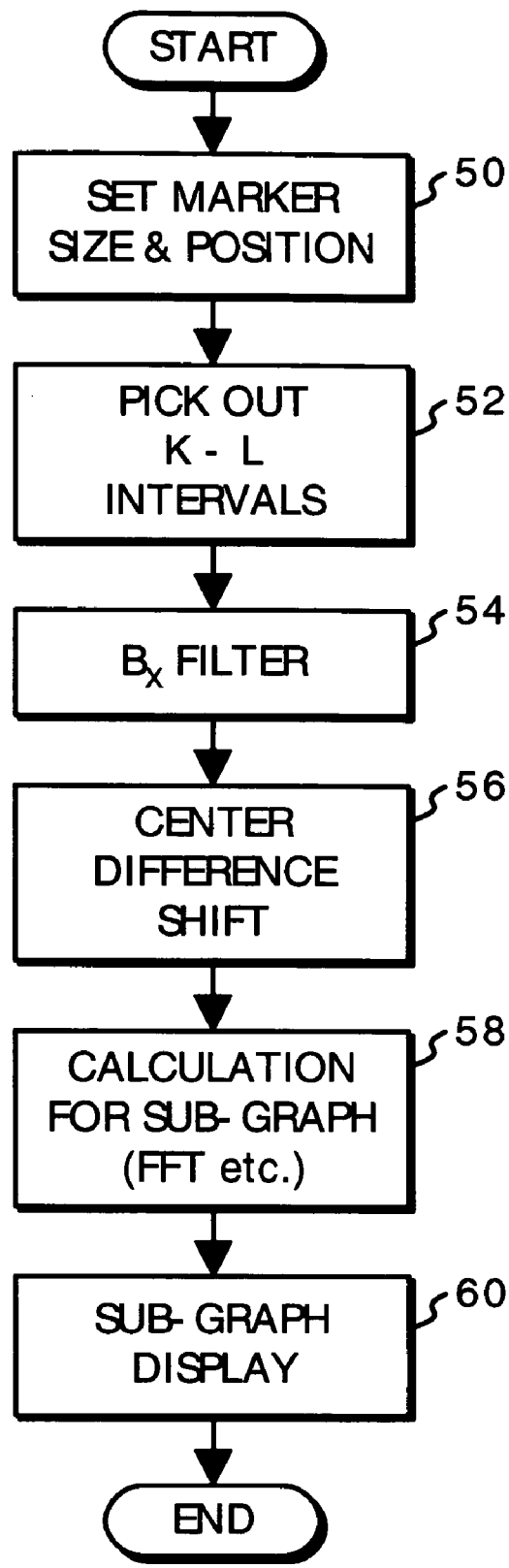
FIG. 7 is a flowchart view of a method of displaying the rectangular marker related sub-graphs according to the present invention.

As shown in FIG. 7 a rectangle marker 24 is presented on the spectrogram, the marker having a time side, or scale $B_Y$, and a frequency side, or scale (bandwidth) $B_X$. The rectangle marker 24 is located at a user-desired position, and has a user-desired size (FIG. 7, step 50). View areas B, C and D show displays, or sub-graphs, relating to the portion defined by the rectangle marker 24. To provide this display the intervals from Kth to Lth ones of the $B_Y$ side in the $T_{IQW}$ are extracted (step 52) and filtered by a width of $B_X$ (step 54) to obtain the following equation wherein K and L are the first and last frames, or intervals of the $B_Y$ side:

$$T_{IQF} = \text{Filter } M_X [T_{IQK} \ldots T_{IQL}]$$

$T_{IQF}$ is shifted by a frequency Fd that is the difference between the center frequency Fc and the center frequency $B_{XC}$ of the rectangle marker 24 (step 56). This leads to the following equation $T_{ZM}$ of the IQ time domain data:

$$T_{ZM} = \text{Shift } Fd[T_{IQF}]$$

A spectrum $F_{ZM}$ of the analysis range is calculated from $T_{ZM}$ by the FFT calculation and a user designated window function Wn as shown in the following equation. Power calculation thereof produces a power spectrum (step 58), and then view area B, or the left lower quarter of the display, shows an extended power vs. frequency display (sub-graph B) about the frequency span $B_X$ as shown in FIG. 6 (step 60).

$$F_{ZM} = FFT[Wn * T_{ZM}]$$

On the other hand, the time domain data is directly calculated from $T_{ZM}$ (step 58), and view area D, or the right upper quarter of the display, shows a power vs. time display (sub-graph D) as shown in FIG. 6 (step 60). $T_{ZM}$ is also sent to a program for digital demodulation or standard signal analysis (step 58), and the view area C, or the right lower quarter of the display, shows a modulation domain display (sub-graph C), such as a constellation or EVM display as shown in FIG. 6 (step 60).

As described above, the present invention specifies time and frequency ranges using the rectangle marker 24 which are of particular interest to the user, while providing an overview of the signal under test in regard to time, frequency and magnitude by means of the spectrogram shown in the view area A. Spectrum information and power vs. time of the area designated by the rectangle marker 24 may be simultaneously displayed, and also the analytical view area simultaneously shows an analytical result for the time and frequency range designated by the rectangle marker. Therefore, the present invention effectively analyzes and displays the entire picture and partial aspects of the signal under test in both the time and frequency domains. The combination with well-known trigger techniques makes it easy to pick out and analyze a desired portion in a complex signal.

Though the present invention has been described based on the preferred embodiments, it is apparent for those skilled in the art how to modify them within the scope of the invention. For example, the described embodiments use short interval FFTs to produce spectrogram data, but Wigner-Ville Distribution is also available. The positions of the graphs are changeable according to a user setting.

Thus the present invention is suitable for measuring and analyzing a complex digital modulation signal used for a cell phone of the new generation using a signal analyzer by specifying a portion of the complex that is of particular interest to a user while the user sees an overview of the signal under test so that it easy to find problems hidden in the complex signal under test and measurement or analysis time is reduced.

What is claimed is:

1. A method for a signal analyzer of displaying a signal under test comprising the steps of:
    displaying data for the signal under test as a graph on a screen having time and frequency axes;
    displaying a marker having variable time and frequency scales on the graph;
    designating as desired data the data within the marker; and
    displaying a sub-graph relating to the desired data;
    wherein the designating step comprises the steps of:
    selecting the data for signal under test from the time scale;
    filtering the selected data according to the width of the frequency scale; and
    shifting the filtered data by a difference between a center frequency of a span on the graph and a center frequency of the marker.

2. The method as recited in claim 1 wherein the graph comprises a spectrogram.

3. The method as recited in claim 1 wherein the marker comprises a rectangle.

4. The method as recited in claim 1 wherein the sub-graph comprises a sub-graph selected from the group consisting of power vs. frequency, power vs. time and analytical graph.

5. A signal analyzer comprising:
means for producing frequency domain data from time domain data for a signal under test;
means for displaying the frequency domain data as a graph as a function of time;
means for designating via a marker on the graph desired data by variable time and frequency scales; and
means for displaying a sub-graph relating to the desired data;
wherein the means for designating comprises:
means for selecting the data for the signal under test from the time scale;
means for filtering the selected data according to the width of the frequency scale; and
means for shifting the filtered data by a difference between a center frequency of a span on the graph and a center frequency of the marker.

6. The signal analyzer as recited in claim 5 wherein the graph comprises a spectrogram.

7. The signal analyzer recited in claim 5 wherein the marker comprises a rectangle having the variable time and frequency scales.

8. The signal analyzer recited in claim 5 wherein the sub-graph comprises a sub-graph selected from the group consisting of power vs. frequency, power vs. time and analytical graph.

\* \* \* \* \*